United States Patent [19]

Hughes et al.

[11] 4,321,613

[45] Mar. 23, 1982

[54] FIELD EFFECT DEVICES AND THEIR FABRICATION

[75] Inventors: Brian T. Hughes, Sandy; John C. Vokes, Harpenden; David R. Wight, Hitchin, all of England

[73] Assignee: The Secretary of State for Defence in Her Britannic Majesty's Government of the United Kingdom of Great Britain and Northern Ireland, London, England

[21] Appl. No.: 43,977

[22] Filed: May 31, 1979

[30] Foreign Application Priority Data

May 31, 1978 [GB] United Kingdom ............... 25554/78

[51] Int. Cl.³ .................. H01L 21/20; H01L 21/302; H01L 29/80
[52] U.S. Cl. ....................................... 357/22; 29/571; 29/580; 29/589; 29/590; 148/171; 148/175; 357/15; 357/4; 357/68
[58] Field of Search ................. 29/571, 580, 589, 590; 148/171, 172, 175; 357/15, 22, 4, 68

[56] References Cited

U.S. PATENT DOCUMENTS

| | | | |
|---|---|---|---|
| 3,621,565 | 11/1971 | Sandstrom et al. | 29/590 |
| 3,823,467 | 7/1974 | Shamash et al. | 29/580 |
| 3,914,137 | 10/1975 | Huffman et al. | 148/187 X |
| 3,930,912 | 1/1976 | Wisbey | 29/591 X |
| 3,972,770 | 8/1976 | Stein | 156/600 |
| 4,048,712 | 9/1977 | Buiatti | 29/580 X |
| 4,049,488 | 9/1977 | Tijburg | 156/655 |
| 4,136,352 | 1/1979 | Moutou et al. | 357/22 |
| 4,193,836 | 3/1980 | Youmans et al. | 29/578 X |

FOREIGN PATENT DOCUMENTS

| | | |
|---|---|---|
| 1514943 | 9/1969 | Fed. Rep. of Germany . |
| 2386903 | 11/1978 | France . |
| 1129891 | 10/1968 | United Kingdom . |
| 1222898 | 2/1971 | United Kingdom . |
| 1228854 | 4/1971 | United Kingdom . |

*Primary Examiner*—G. Ozaki
*Attorney, Agent, or Firm*—Pollock, Vande Sande & Priddy

[57] ABSTRACT

A method of fabricating a field effect transistor comprising the steps of forming an active layer of semiconductor material, e.g. GaAs over the surface of a first substrate of semiconductor material, e.g., also GaAs, forming source, drain and gate electrodes over the surface of the active layer, applying a second substrate of insulating material to the surface of this structure, and removing the first substrate. To facilitate the removal of the GaAs first substrate by selective etching, a buffer layer of GaAlAs resistant to the GaAs etchant may be formed between the first substrate and active layer, which buffer layer is removed, following removal of the first substrate, using a selective etchant to which the GaAs active layer is resistant. A second gate electrode may be formed on the active layer following removal of the first substrate. The technique is particularly applicable to high frequency FET devices.

27 Claims, 10 Drawing Figures

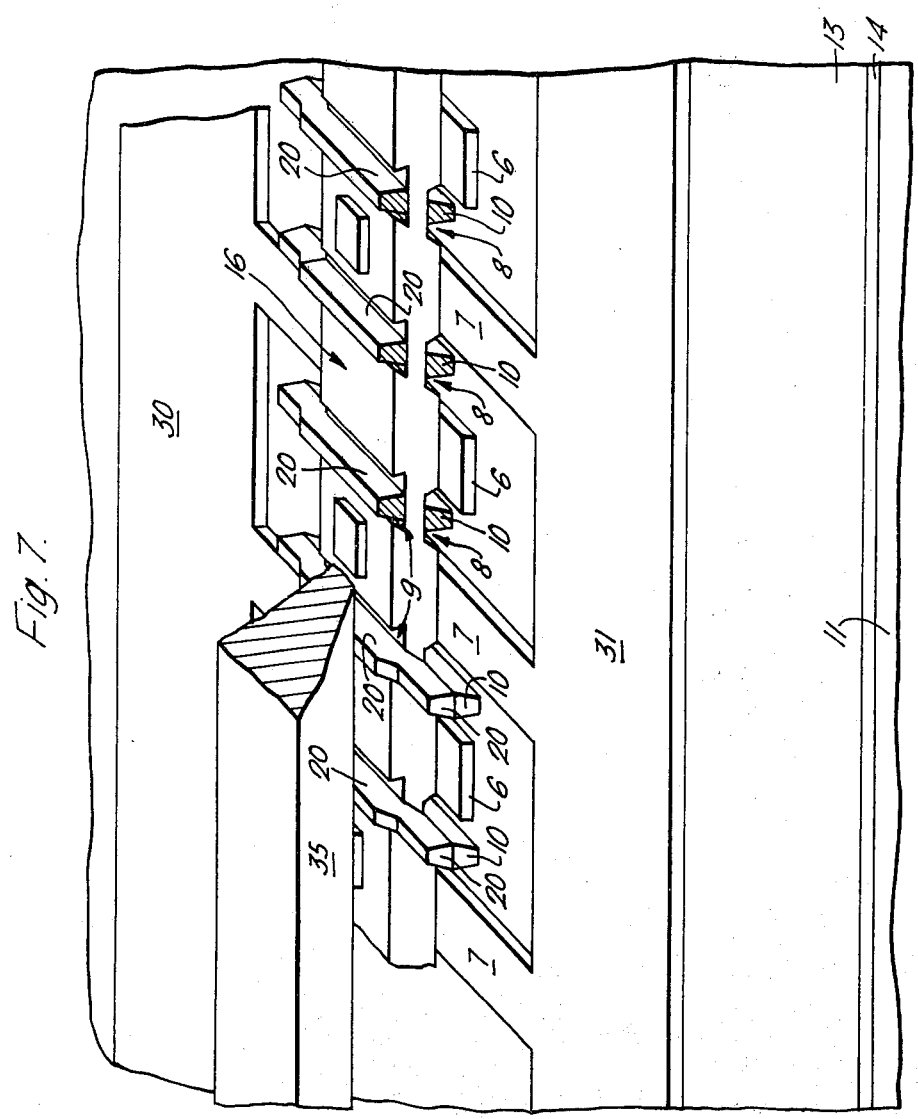

FIELD EFFECT DEVICES AND THEIR FABRICATION

CROSS REFERENCE TO RELATED APPLICATIONS

The subject matter of the instant application is related to the inventions described and claimed in Hughes et al. Applications Ser. No. 43,979 and Ser. No. 44,274, both filed May 31, 1979, for "Improvements In Or To FET Devices And Their Fabrication".

This invention relates to methods of fabricating field-effect transistors (FETs) and to FET devices fabricated by such methods.

Conventional low-noise microwave FETs normally comprise a high resistivity or semi-insulating semiconductor substrate formed with a thin high-quality epitaxial active layer on which the source, gate and drain electrodes are formed.

Theoretical and experimental evidence suggests that the performance of conventional low-noise microwave FETs, and also to a certain extent power FETs, is limited because of a reduction in the mutual conductance ($g_m$) of the device as the gate bias is increased towards pinch-off. It is thought that the major reasons for this reduction in mutual conductance is that charge carriers in the active channel region underlying the gate electrode are forced into the substrate at high gate biases, with a resultant 'softening' of the I-V characteristics. To enable high mutual conductance to be achieved near pinch-off, it is desirable to maintain the charge carriers within the active layer.

It has been proposed to adapt the technology developed for the fabrication of GaAs photocathodes to the fabrication of low-noise non-coplanar GaAs FETs to enable the active channel region underlying the gate electrode to be interfaced to a good insulator instead of to the usual high resistivity of semi-insulating GaAs substrate, and to enable the gate electrode be placed on the opposite side of the active layer to the source and drain electrodes (non-coplanar). A method of fabricating such an FET is described in Annual Report No. (1976-1975) prepared by D. R. Decker and S. G. Baundy of Varian Associates, Palo Alto, Calif. under contract No. N00014-75-C-0303 with the U.S. Office of Naval Research, which publication is abstracted in U.S. Government Reports Announcements Vol. 77, No. 5 field 9A under No. ADA032809.

The described method involves formation of ohmic source and drain electrodes on the surface of an epitaxial active layer formed on a semiconductor substrate; sealing this surface to a dielectric support substrate; removing the original semiconductor substrate using differential etching; and then forming a gate electrode on the surface of the active layer opposite to that on which the source and drain electrodes are formed.

According to the present invention, a method of fabricating a field effect transistor comprises the steps of forming an active layer of semiconductor material over a surface of a first substrate of semiconductor material, forming source, drain and gate electrodes over the surface of the active layer, applying a second substrate of insulating material over the surface of the substrate comprising the first substrate and active layer on which the electrodes are formed, and removing the first substrate.

Because the source, drain and gate electrodes are formed before the second substrate is applied, the second substrate and the means by which it is applied to the first substrate/active layer structure is not required to withstand the thermal and chemical treatments required to form the electrodes, in particular the source and drain electrodes which normally require a high temperature anneal.

In addition, because the gate electrode is formed prior to application of the second substrate, there is no direct interface between the sensitive active layer in the channel region of the device and the second substrate or its bonding medium, and the active layer immediately opposite the gate electrode is advantageously interfaced to air. Thus the channel region of the device is less susceptible to degradation during the fabrication process than in the prior art technique discussed above.

Preferably a buffer layer of high quality semiconductor material is formed on the surface of the first substrate prior to formation of the active layer, this buffer then being removed following removal of the first substrate.

This buffer layer may serve two purposes. Firstly, it may provide a barrier against the migration of impurities from the usually relatively low quality first substrate into the active layer, and secondly it may provide a chemical stopping layer in a selective etching process used to effect removal of the first substrate.

In such a process the first substrate is removed by etching using an etchant which attacks the first substrate at a faster rate than it attacks the buffer layer, and the buffer layer is then removed by etching preferably also using a selective etchant which attacks the buffer layer faster than it attacks the active layer.

If the substrate is of GaAs, e.g., semi-insulating GaAs, and the active layer is of n-type GaAs, the buffer layer preferably then comprises GaAlAs which is selectively removed by etching using HF.

Where the first substrate is removed other than by selective etching as aforesaid, the buffer layer may comprise a high quality layer of the same semiconductor material as the active layer thereby acting as a barrier against the migration of impurities into and the formation of lattice defects in the active layer, which might otherwise arise as a result of its interface with the first substrate.

The necessity for a buffer layer of this latter kind may be obviated by removing a surface thickness of the active layer at least in the channel region immediately opposite the gate electrode, following removal of the first-substrate, this procedure usually being necessary to achieve a desired I/V characteristic for the device.

The source and drain electrodes are preferably formed as ohmic contacts with the active layer, and as such the quality of this contact may be improved in known manner by forming a layer of high conductivity semiconductor material on the surface of the active layer, forming the source and drain electrodes on this high conductivity layer, and then removing a region of this layer in between the source and drain electrodes to enable the gate electrode to be formed as a Schottky barrier contact with the active layer. In addition an underlying thickness of the active layer in this region may also be removed prior to formation of the gate electrode, primarily to remove any impurities or surface defects therein. This may be desirable whether or not a high conductivity layer is provided, to ensure that the source electrode overlies a thicker part of active layer than the gate electrode, thereby reducing the source resistance.

Part of the active layer, and the high conductivity layer where this is present, may be removed by etching to define an isolated mesa containing the channel region of the device. This mesa may either by defined following removal of the first substrate and any buffer layer provided, or before the source, drain and gate electrodes are formed. In the latter case, the mesa may be initially defined by removing only part of the thickness of said part of the active layer, to leave a mesa surrounded by a reduced thickness of active layer material, this layer then being removed following removal of the first substrate, to completely isolate the mesa.

Advantageously, a second gate electrode may be formed in contact with the active layer on the opposite surface to that on which the first gate electrode is formed, either in contact therewith, or electrically isolated therefrom so as to be capable of operation as an independent control electrode. This latter method provides FET devices capable of operation as mixers, AGC amplifiers or high speed logic devices, while the former method can be used to fabricate devices having one or more active conducting channels between the source and drain electrodes each completely surrounded by gate electrode metallization.

The second gate electrode will normally be formed immediately opposite and in register with the first gate electrode, although in some applications it may be offset with respect thereto to effectively reduce the length of the conducting channel.

The second substrate, which may be of any suitable insulating material, may be applied to the surface of the structure comprising the first substrate and active layer using any suitable technique.

Preferably however, a coating of insulating material is first formed on the appropriate surface of the said structure prior to application thereto of the second substrate, using an adhesive for example. The requirements of such an adhesive, or the means by which the second substrate is applied to the insulating coating, in terms of its thermal, chemical and electrical compatibility with the active layer can be considerably relaxed if the coating itself is compatible with the active layer, an easier requirement to meet.

The invention will now be described in greater detail, by way of example only, with reference to the accompanying drawings, in which:

FIGS. 1(a) to 1(c) show schematic sectional views illustrating various stages in the fabrication of a FET by a method in accordance with the present invention;

Figure 6A:
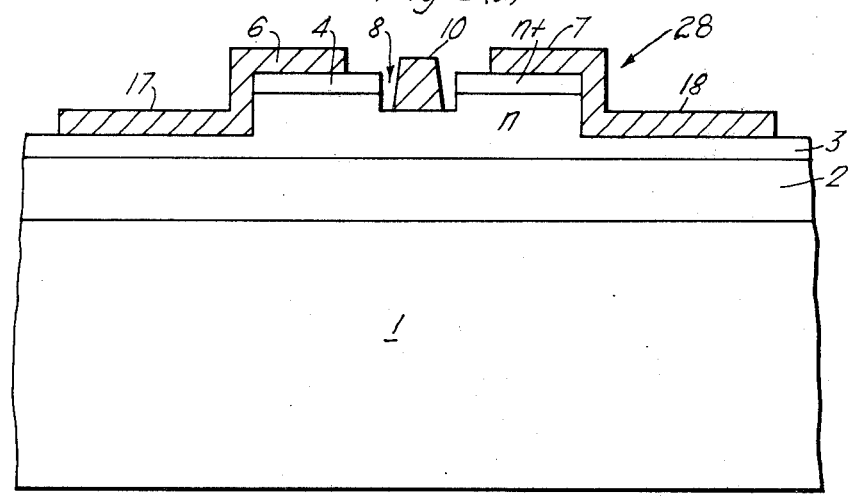
Figure 6B:
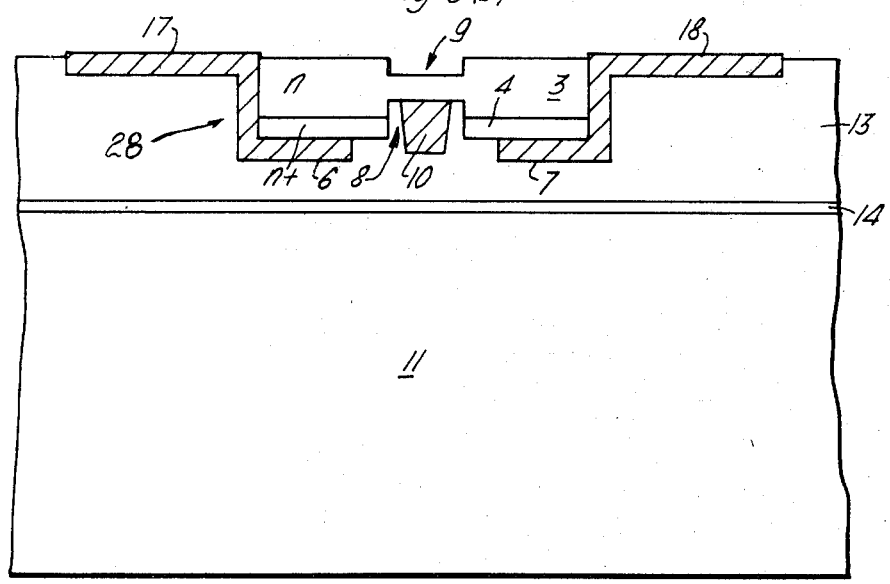

FIGS. 6(a) and 6(b) show schematic sectional views illustrating stages in the fabrication of a FET by a modified method in accordance with the invention; and FIG. 7 shows a part-sectional perspective view of a further form of FET in accordance with the present invention.

Figure 1A:
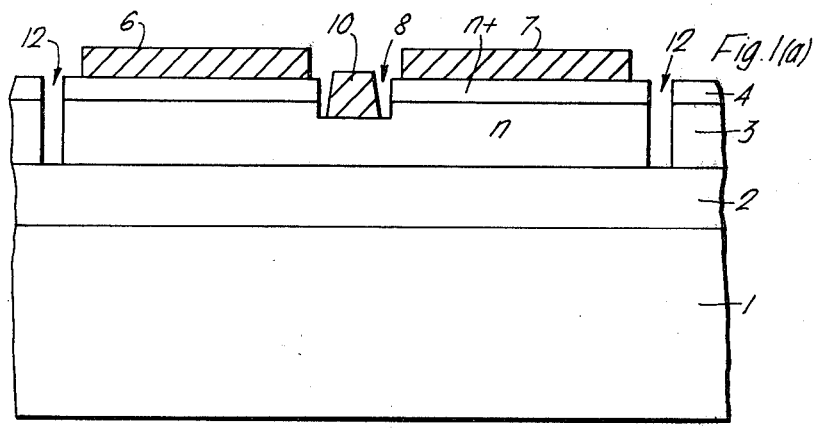
Figure 1B:
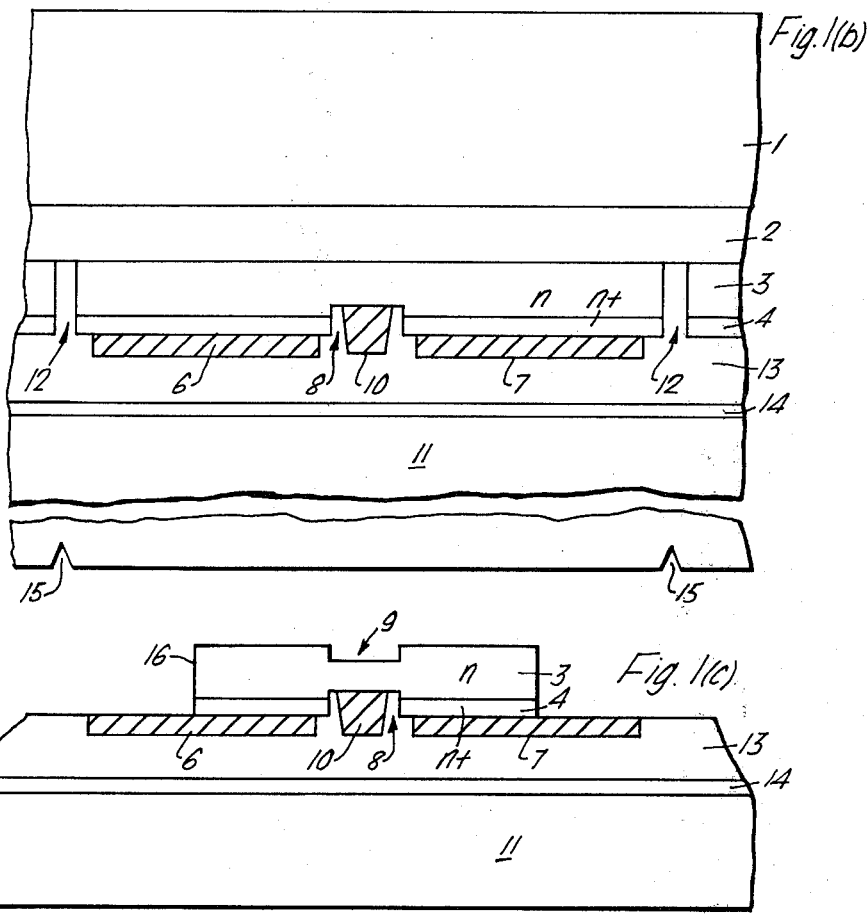
Figure 1C:
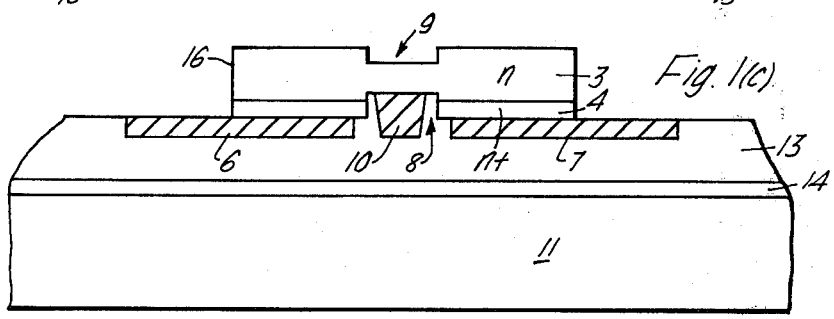

Referring to the drawings, the fabrication procedure illustrated in FIGS. 1(a) to 1(c) initially comprises forming a GaAlAs buffer layer 2 of the order of 2 to 5 microns thick on the surface of a semi-insulating GaAs substrate 1 typically several hundred microns thick, forming on the buffer layer 2 an active layer 3 of n-type GaAs doped to a concentration of $1 \times 10^{17}$ cm$^{-3}$, and having a thickness of the order of 0.2 to 1 μm, followed by a thin high conductivity (n+) layer 4 of GaAs, coped to a concentration of $2 \times 10^{18}$ cm$^{-3}$, and of the order of 0.2 to 0.5 μm thick. Each of these layers is formed by liquid or vapour phase or molecular beam epitaxy using known techniques.

Following formation of the above epitaxial semiconductor layers, source and drain electrodes 6,7 are formed on the surface of the high-conductivity layer 4 to form high quality ohmic contacts with the active layer 3 in known manner. The electrodes 6,7 are formed by applying a metallization layer of, for example, GeAu, over a resist mask, floating-off the metallization layer overlying the resist mask, and then annealing the remaining metal electrodes at a temperature of 450° C. to form the ohmic contacts.

A region of the high conductivity layer 4 between the source and drain contacts is then etched away together with a surface area of the underlying active layer 3 to form a recess 8 in which a gate electrode 10, e.g., of aluminum is formed as a Schottky barrier contact with the active layer. The formation of this process 8 also serves to remove part of the active layer 3 at its interface with the high conductivity layer 4.

At this stage of the fabrication procedure, the configuration of the device FIG. 1(a) resembles that of a conventional co-planar FET, and may be fabricated and dimensioned in accordance with known design and fabrication techniques.

The next stage in the fabrication process involves the application to the structure comprising the semi-insulating GaAs substrate 1 (hereinafter referred to as the first substrate) and active layer 3, of a second substrate 11 of insulating material, followed by removal of the first substrate 1 and the buffer layer 2 after which the remaining stages of the device fabrication are completed.

However, to enable these later fabrication steps to be correctly aligned with the existing device elements which will become hidden under the active layer, alignment holes 12 are etched through the high conductivity and active layers 4,3 to the buffer layer 2 prior to the application of the second substrate, conveniently after the formation of the source and drain electrodes 6,7 and before the formation of the gate electrode 10.

The method by which the second substrate 11 is applied to the semiconductor structure and the materials used, are determined to a large extent by the need to avoid degradation of the active layer 3 and the Schottky barrier gate electrode, and also by the requirement that the bond between the second substrate and the semiconductor structure should not be affected by the temperatures and chemicals to which the structure is subjected in later stages of the fabrication process. The thickness of the second substrate 11 is not critical, typically being of the order of 2 mm.

A preferred method of applying the second substrate 11 which may be of any suitable insulating material, in the present example, alumina, comprises first forming on the surface of the active and high conductivity layers 3,4 a coating 13, of insulating material, typically several tens of microns thick, which is a good thermal expansion match and chemically inactive with GaAs, and also has good microwave properties. The second substrate 11 is then applied to this low-loss coating 13 using a suitable adhesive 14.

One suitable insulating material for the coating 13 is polyimide resin, such as that sold under the name of KERIMID (Registered Trade Mark) 601 by Rhone Pouleno, a condensation-type polymer resin. The resin, which is sold in powdered form, is first dissolved in a solvent, and applied to the surface of the active and high conductivity layers 3,4 and the coated structure then spun at high speed to achieve a uniform coating of the desired thickness. The solvent is then dried by heating to a temperature of about 120° C. before curing at a temperature of the order of 220° C. to give a hardened substantially bubble-free coating.

To improve the quality of the coating 13, it may be built up from a number of successively applied thinner layers (typically each of sub-micron thickness) successive layers being cured before application of the next.

Any suitable adhesive 14, which need not have such good properties, nor be such a good thermal expansion match or chemically inactive with GaAs, may then be used to apply the second substrate 11 to the coating 13. For the purposes of the present embodiment, the same polyimide resin material may be used as the adhesive 14 either applied as a solution and then cured to form the bond, or in powder form sandwiched under pressure between the second substrate 11 and the coating 13 and then heated to curing temperature.

Other suitable materials which may provide the low-pass coating 13 include $SiO_2$, polycrystalline GaAs, $Si_3N_4$, alumina and glass applied by sputtering, evaporation, or ion beam deposition as appropriate, all of which can be carried out at suitably low temperatures to avoid degradation of the Schottky contact and active layer. A further possibility in the case of glass is to apply it as a glass frit, e.g., using borosilicate glass, which is then heated to melting point to form of fused glass coating. However this method requires heating to a relatively high temperature depending on the type of glass used.

Furthermore, the second substrate 11 need not be applied to the coating 13 using an adhesive. It may for example be formed in situ on the coating 13 using any suitable technique, and may be of the same or different material as the coating.

The purpose of the coating 13 is to provide a good quality mechanical barrier immediately adjacent the sensitive active layer which permits a wider range of materials and techniques to be used in applying the second substrate by relaxing the chemical, thermal and microwave properties required of them. The coating 13 could of course be omitted, and the second substrate applied directly to the surface of the semiconductor structure, using an adhesive for example, but this would place exacting demands upon the properties of such an adhesive and on the quality of the resultant bond between the second substrate and the semiconductor structure.

To facilitate the dicing operation carried out at the end of the device fabrication to separate the structure into individual device chips, the second substrate 11 is lapped down to a thickness of the order of 0.4 mm, and a series of slots 15 then cut into its rear surface along which structure will later be cleaned. During these operations the active layer is protected on opposite sides by the first and second substrates.

The next stage in the fabrication procedure is the removal of the first substrate 1 and the buffer layer 2 using selective etchants. The first substrate is removed using a 95:5 100 V $H_2O_2$, 35% $NH_4OH$ mixture which attacks GaAs at a much faster (about two orders of magnitude) than it attacks GaAlAs, the GaAlAS thus acting as a chemical stop causing the etch to stop abruptly at the GaAs/GaAlAS interface (the term 100 V $H_2O_2$ is an abbreviation for 100 Volume $H_2O_2$ and refers to the strength of the peroxide. "Volume" is a standard term for measuring the strength to $H_2O_2$ in solution; thus the strength of x Volume $H_2O_2$ is such that it evolves x times its own volume of $O_2$ on complete decomposition to $H_2O$ and $O_2$). The GaAlAs buffer layer 2 is then removed using a different selective etchant, a 50% solution of HF which attacks GaAlAs at a much faster rate than it attacks GaAs (the rate being dependent upon the proportion of Al in the GaAlAs), so that the underlying high-conductivity GaAs layer 4 acts as a chemical stop to the HF etchant. The resultant structure is shown in FIG. 1(b) comprising an insulating substrate 11, supporting the active and high conductivity GaAs layers 3,4 above the adhesive layer 14 and the low-loss coating 13, with the gate electrode 10 now underlying the active layer 3.

Parts of the active and high conductivity GaAs layers 3,4 are then removed by etching using a photo- or electron-lithographically formed resist mask suitably aligned with the alignment holes 12 revealed by the removal of the first substrate 1 and buffer layer 2, to form a separate isolated mesa 16 for each device on the surface of the low-loss coating 13.

A groove or recess 9 is then formed in the surface of the active layer 3 on top of the mesa 16 immediately opposite the gate electrode 10 to reduce the thickness of the conducting channel to the desired thickness, i.e., in the range 0.1 to 0.3 $\mu$m.

Figure 2:
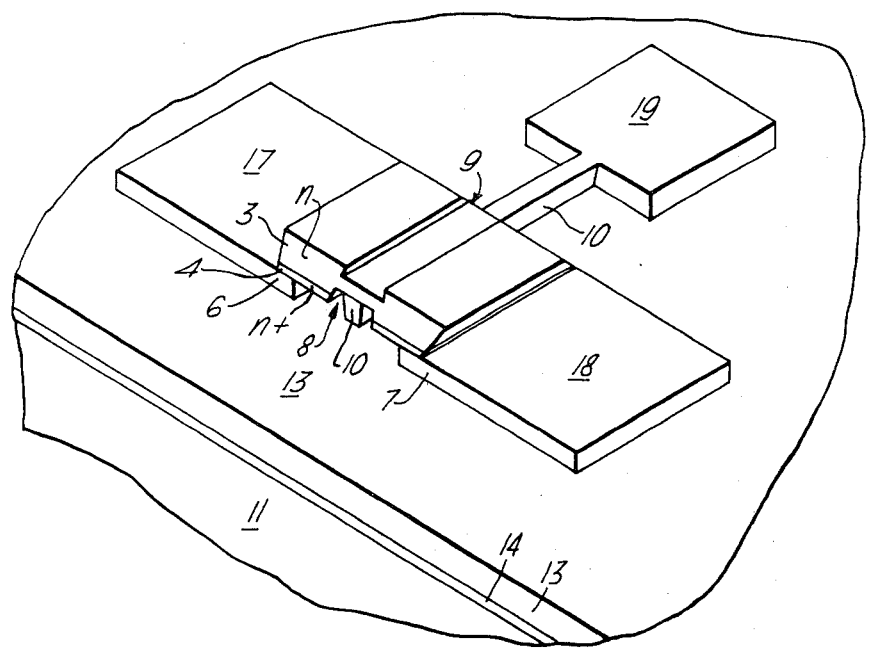
FIG. 2 is a diagrammatic perspective view of a FET fabricated by the method illustrated in FIG. 1.

The formation of the mesa also serves to expose contact pad portions 17,18,19 of the source, drain and gate electrodes respectively as shown in FIG. 2, which illustrates a typical completed device structure showing the crystal orientation of the GaAs mesa 16. By using an orientation-sensitive etchant such as $H_2O_2:NH_4OH$, and selecting the appropriate crystal orientation, the groove 9 can be made either 'A' cross-section as illustrated, in which case the groove on recess 8 will be of 'V' cross-section; or of 'V' cross-section, in which case the groove 8 will be of 'A' cross-section. The inclination of the edges of the mesa is also dictated by the crystal orientation of the GaAs. As illustrated the edges of the mesa parallel to the recesses 8,9 are undercut, while those perpendicular to them slope outwardly, the opposite being the case with the alternative orientation.

Figure 3:
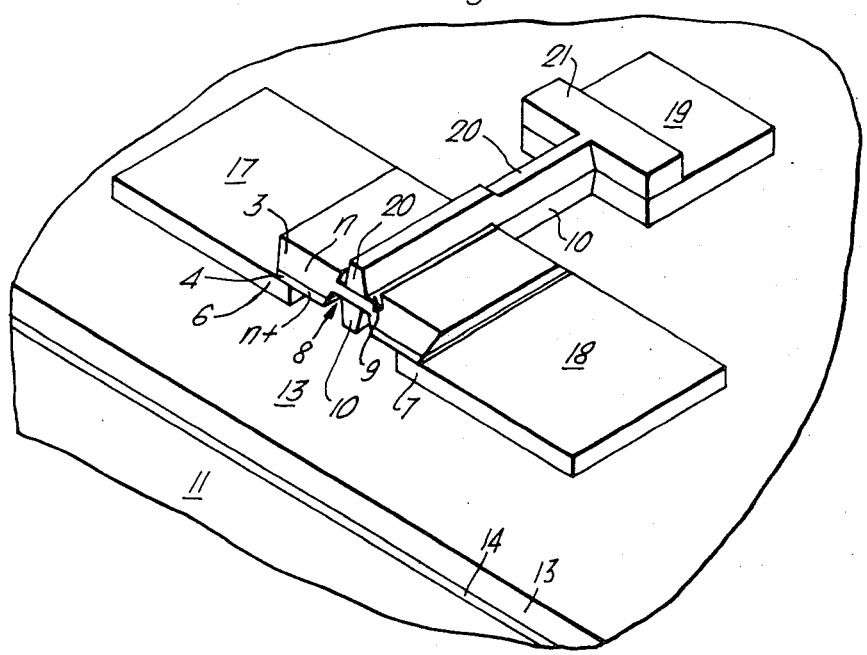
FIGS. 3, 4 and 5 are diagrammatic perspective views of modified forms of FET in accordance with the present invention.
Figure 4:
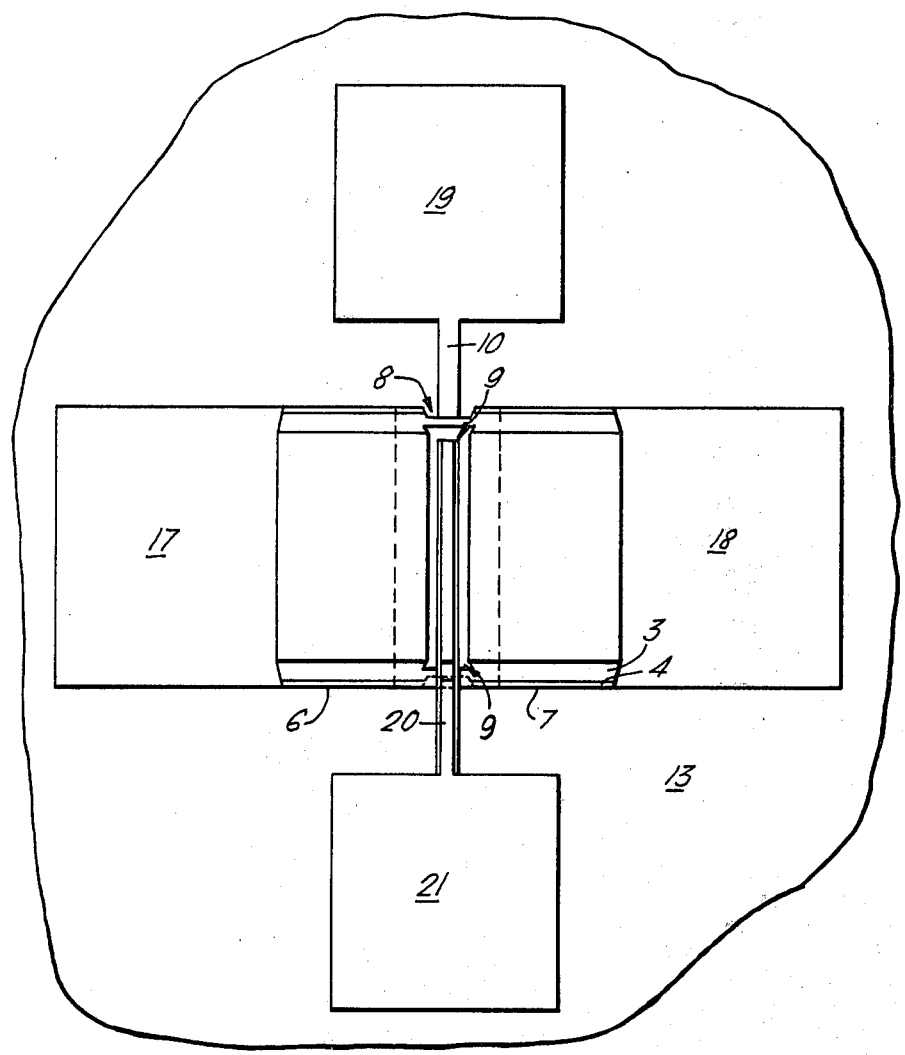

The crystal orientation becomes important in the fabrication of the modified FETs illustrated in FIGS. 3 and 4, in which it will be seen that a second Schottky barrier gate electrode 20 has been added to the device structure in alignment with the first gate electrode 10.

Turning first to the FIG. 3 arrangement, the second gate electrode 20 is formed in the groove 9 and extends over the outwardly-sloping edge of the mesa 16 into contact with the first gate electrode 10, and also terminates in an enlarged contact pad portion 21 which partially overlies that of the first gate electrode 10. The channel region of the active layer 3 is thus sandwiched between the two gate electrodes which, in operation, are commonly biased to produce pinch off from both sides of the channel. In addition, because the two gate electrodes are connected in parallel, the gate resistance is reduced by a factor of four. The selected crystal orientation enables the second gate electrode 20 to pass continuously over an outwardly-sloping edge thereof.

A suitable alternative method of removing the GaAs to form the mesa and the recesses 8,9 is ion milling. Because this process is independent of the crystal orientation, the problems associated with the passage of the second gate electrode 20 over the mesa edge do not arise. The edge of the mesa over which this gate electrode 20 passes can be suitably inclined regardless of the crystal orientation.

In the FIG. 4 arrangement, the second gate electrode 20 extends over the opposite edge of the mesa 16 to that over which the first gate electrode 10 passes, so as to be electrically isolated from the first gate electrode 10. The two gate electrodes 10,20 can thus be used as independent control electrodes enabling devices of this configuration to be used for example, as mixers, AGC amplifiers or as high speed logic elements.

In this latter connection, a single device could be made to act as a NAND, a NOR or a NOT gate by selecting the thickness of the active layer in the channel region in accordance with the design of a NAND gate, in which in operation an output signal is produced only by simultaneous application of negative biases to both gate electrodes (nominally held at 0 volts) to achieve pinch-off and thereby a positive increase in drain voltage.

The same device may then be made to operate as a NOT gate by applying a permanent negative bias voltage equal to half the required pinch-off voltage to one of the gate electrodes. Application of a similar negative bias to the other gate electrode will then cut off the channel current and produce an output represented by a positive increase in drain voltage. By similarly biasing one of the gates as for the NOT gate, operation as a NOR gate may also be achieved in that a negative signal on either gate will produce pinch-off.

Thus, the logic function of a single device may be changed electronically rather than by electrical connections. Alternatively, the devices may be designed to operate either as NAND, NOR or NOT gates without biasing, by appropriate selection of the thickness of the active layer in the channel region, the NAND gate then having twice the channel thickness of a NOR or NOT gate.

In logic applications where such FETs are normally-off under zero gate bias, the provision of a second independently controllable gate electrode enables variations in the thickness and/or doping characteristics of the active channel region (e.g., due to fabrication tolerances) to be compensated by applying a suitable bias to one of the two gates ensuring that the depletion regions meet when there is no bias on the other gate. In use, the correction bias applied to one of the gates may be individually adjusted to correct individual devices, or to correct individual integrated circuits or portions of integrated circuits.

Although in the embodiment illustrated in the drawings, the second gate electrode is placed immediately opposite and in register with the first gate electrode, this need not be the case. For example, the second gate electrode may be parallel to, but offset with respect to the the first gate electrode in the direction of charge transfer, whereby to produce a device having an effectively reduced channel length, desirable for high frequency operation.

For some applications more than one gate electrode may be provided on one or both sides of the active layer.

Figure 5:
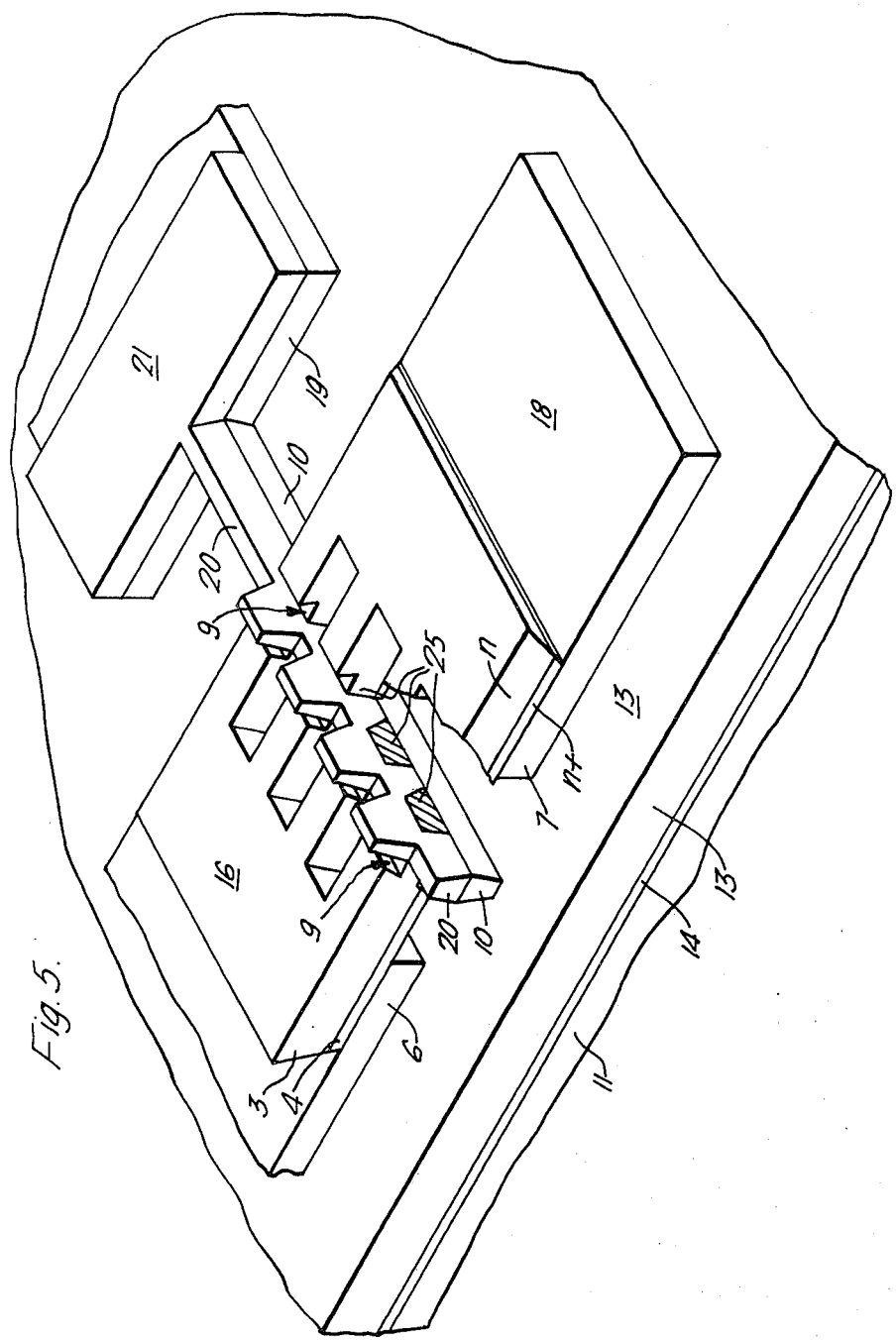

A modified form of the device shown in FIG. 3 is illustrated in FIG. 5, in which discrete areas of the active layer 3 in the channel region between the source and drain electrodes are etched away (at any suitable stage in the fabrication procedure after removal of the first substrate and buffer layer) leaving a number of filaments 25 of active GaAs extending across the line of the first gate electrode 10. The second gate electrode 20 is then formed in register with the first gate electrode making contact wherewith through the holes between the filaments 25 as well as at both ends. The device has a plurality of filamentary active channels each completely surrounded by gate metallization. If the aspect ratio of each filament is made approximately square, each filamentary channel will be structurally similar and thus have similar electrical properties, to a conventional cylindrical FET. Each filamentary channel will be pinched-off from all directions during operating rather than from two opposing planes, enabling lower gate capacitances to be achieved and possibly further improving the devices mutual conductance.

Where appropriate, an alternative fabrication procedure may be used, in which the mesa is partially defined before application of the second substrate. Various stages in this modified procedure which can be used for any of the above devices, are illustrated in FIGS. 6(a) and 6(b).

Thus following formation of the GaAlAs buffer layer 2, the active GaAs layer 3 and the high conductivity layer 4 on the surface of the semi-insulating GaAs substrate 1, a region of the high conductivity layer 4 and part of the thickness of the underlying active layer 3 is etched away to define a mesa 28 surrounded by an active layer of reduced thickness. As before a recess 8 is then formed in the top surface of the mesa and the gate electrode 10 formed as before with a narrow elongated gate line portion extending over the mesa edge into an enlarged contact pad portion 19 remote from the mesa. The orientation of the GaAs is selected as shown to enable the gate electrode 10 to traverse the mesa edge over an outwardly sloping surface, castellations (not shown) then being required for the source and drain electrodes. Alternatively, ion milling may be used to form the mesa 28 and recesses 8,9 thereby avoiding difficulties associated with the crystal orientation.

The remaining device fabrication procedure is then substantially as described above in connection with FIG. 1 up to removal of the GaAlAs buffer layer 2, after which the whole surface of the active layer is etched away, at least through its reduced thickness, thereby completely isolating the previously defined mesa 28 and exposing the contact pads 17,18,19 of the source, drain and gate electrodes. The recess 9 is then formed to provide the required channel thickness, and a second gate electrode 20 in accordance with the FIG. 3, 4 or 5 devices may then be formed as before, in the case of the FIG. 5 type device, the active channels 25 being defined prior to formation of the second gate electrode.

FIG. 7 illustrates yet a further FET device fabricated in accordance with the present invention comprising a plurality of FETs connected in parallel on a common insulating substrate 11 to provide a device capable of high power operation.

The device comprises a row of FETs, only five of which are shown, formed along a common elongate mesa 16 of active GaAs material. As shown each device is similar in configuration to, and may be fabricated using the same techniques as used for the device shown in FIG. 3, except that the enlarged contact pad portions 19,21 of the gate electrodes 10,20 are omitted, and adjacent FETs share common source and drain electrodes 6,7 which are connected together by respective bus bars 30,31 running parallel with the mesa on opposite sides thereof. Also the two gate electrodes 10,20 of each device make contact at both edges of the mesa 16.

The gate electrodes 10,20 of each device are connected together by means of a gate bus line 35 which contacts, and is partially supported by, the second gate electrode metallization 20 of each device, thereby also serving as a heat sink.

Although it is preferred to fabricate devices in accordance with the invention using GaAs as the semiconductor material, the invention is not restricted to the use of this particular material.

Particularly in the case of structures having opposed gates electrodes on opposite sides of the active layer, a second set of source and drain electrodes may be added to the device structure following removal of the first substrate, and the buffer layer where this is provided.

An alternative method of selective etching which may be used to remove the first substrate is described in "Preferential Etch Scheme for GaAs-GaAlAs" by C. B. Burstell, R. Y. Hung and P. G. McMullin, IBM Technical Disclosure Bulletin, Vol. 20, No. 6, p. 2451, November 1977.

What we claim is:

1. A method of fabricating a field effect transistor comprising the steps of forming an active layer of semiconductor material over a surface of a first substrate of semiconductor material, forming source, drain and gate electrodes over the surface of the active layer, applying a second substrate of insulating material over the surface of the structure comprising the first substrate and active layer on which the electrodes are formed, and removing the first substrate, said method further including the steps of forming a buffer layer of high quality semiconductor material on the surface of the first substrate prior to formation of the active layer, said buffer layer being thinner than said first substrate, and removing said buffer layer following removal of the first substrate.

2. A method as claimed in claim 1, wherein the buffer layer is removed by etching using a selective etchant which attacks the buffer layer at a faster rate than it attacks the active layer.

3. A method as claimed in claim 2, wherein the first substrate is removed by etching using a selective etchant which attacks the first substrate at a faster rate than it attacks the buffer layer.

4. A method as claimed in claim 3, wherein the first substrate is semi-insulating GaAs, the buffer layer is GaAlAs and the active layer is n-type GaAs.

5. A method as claimed in claim 4, wherein the buffer layer is removed with HF.

6. A method as claimed in claim 1, wherein prior to formation of the source, drain and gate electrodes, a layer of high conductivity semiconductor material is formed on the surface of the active layer and the source and drain electrodes are then formed as ohmic contacts thereon, and wherein, prior to formation of the gate electrode, a part of said high conductivity layer is removed to enable said gate electrode to be formed as a Schottky barrier contact with the active layer.

7. A method as claimed in claim 1 or 6, wherein each of said layers is formed by epitaxial growth.

8. A method as claimed in claim 1 wherein the second substrate is applied to the structure comprising the first substrate, the buffer layer, and the active layer by first coating the appropriate surface of the structure with a coating of insulating material and then applying the second substrate to said coating.

9. A method as claimed in claim 8 wherein the second substrate is bonded to the said insulating coating using an adhesive comprising a polyimide resin applied in liquid form and cured before application of the second substrate.

10. A method as claimed in claim 8 or 9 wherein the insulating coating comprises either $SiO_2$, glass, polycrystalline semiconductor material, alumina, or $Si_3N_4$ applied either by evaporation, sputtering or ion deposition as appropriate.

11. A method as claimed in claim 1 or 8 wherein the second substrate is formed in situ.

12. A method as claimed in claim 11 wherein the second substrate is formed by moulding.

13. A method as claimed in claim 12 wherein the second substrate comprises polyimide resin.

14. A method as claimed in claim 1, wherein the second substrate is applied directly to the structure comprising the first substrate, buffer layer and active layer by means of an insulating adhesive comprising cured polyimide resin.

15. A method of fabricating a field effect transistor comprising the steps of forming an active layer of semiconductor material over a surface of a first substrate of semiconductor material, forming a recess in the active layer, forming a gate electrode in said recess, forming source and drain electrodes over the surface of the active layer, applying a second substrate of insulating material over the surface of the structure comprising the first substrate and active layer on which the electrodes are formed, and removing the first substrate.

16. A method of fabricating a field effect transistor comprising the steps of forming an active layer of semiconductor material over a surface of a first substrate of semiconductor material, forming source, drain and gate electrodes over the surface of the active layer, applying a second substrate of insulating material over the surface of the structure comprising the first substrate and active layer on which the electrodes are formed, removing the first substrate, and thereafter removing an area of the semiconductor material supported by the second substrate to define an isolated mesa of the semiconductor material overlying a part of each of said electrodes, a further part of each of said electrodes being exposed to provide contact areas for external connections to the device.

17. A method of fabricating a field effect transistor comprising the steps of forming an active layer of semiconductor material over a surface of a first substrate of semiconductor material, removing an area of the active layer to define a mesa, forming source, drain and gate electrodes over the surface of the active layer, the source, drain and gate electrodes being formed each with a portion overlying the top surface of the mesa and a portion extending continuously over the edge of the mesa onto the surface of the surrounding structure, applying a second substrate of insulating material over the surface of the structure comprising the first substrate and active layer on which the electrodes are formed, and removing the first substrate.

18. A method as claimed in claim 17, wherein only part of the thickness of said area of the active layer is removed prior to formation of the electrodes to define a mesa surrounded by a layer of active semiconductor material of reduced thickness, and following removal of the first substrate, the surface of the active layer is removed at least through the depth of said layer of reduced thickness, thereby isolating the mesa and exposing the portions of the source, drain and gate electrodes underlying the layer of reduced thickness.

19. A method of fabricating a field effect transistor comprising the steps of forming an active layer of semiconductor material over a surface of a first substrate of semiconductor material, forming source, drain and gate electrodes over the surface of the active layer, applying a second substrate of insulating material over the surface of the structure comprising the first substrate and active layer on which the electrodes are formed, removing the first substrate, and thereafter removing a surface thickness of the active layer immediately opposite the gate electrode and between the source and drain electrodes.

20. A method of fabricating a field effect transistor comprising the steps of forming an active layer of semiconductor material over a surface of a first substrate of semiconductor material, forming source, drain and gate electrodes over the surface of the active layer, applying a second substrate of insulating material over the surface of the structure comprising the first substrate and active layer on which the electrodes are formed, removing the first substrate, and thereafter forming a second gate electrode in contact with the opposite surface of the active layer to that on which the first gate electrode is formed.

21. A field effect transistor fabricated by a method as claimed in any one of the claims 1, 20, or 8.

22. A field effect transistor device comprising a plurality of FETs as claimed in claim 21, connected in parallel on a common insulating substrate.

23. A method as claimed in claim 20, wherein part of the second gate electrode is formed in electrical contact with the first gate electrode.

24. A field effect transistor fabricated by a method as claimed in claim 23, wherein the first and second gate electrodes make contact with one another in at least two places separated by a part of the active layer between the source and drain electrodes, each said part of the active layer thus providing a conducting channel for the device completely surrounded by gate electrode metallization.

25. A method as claimed in claim 23, wherein the first and second gate electrodes make contact with one another in at least two places separated by a part of the active layer between the source and drain electrodes, each said part of the active layer thus providing a conducting channel for the device completely surrounded by gate electrode metallization.

26. A method as claimed in claim 20, wherein the second gate electrode is formed in electrical isolation from the first gate electrode.

27. A method as claimed in claim 20, 23 or 26, wherein the second gate electrode is formed immediately opposite and in register with the first gate electrode.

* * * * *